United States Patent
Tsoi

(10) Patent No.: US 7,061,763 B2
(45) Date of Patent: Jun. 13, 2006

(54) CABINET COOLING

(75) Inventor: Vadim Tsoi, Akersberga (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 126 days.

(21) Appl. No.: 10/502,385

(22) PCT Filed: Jan. 29, 2002

(86) PCT No.: PCT/SE02/00148

§ 371 (c)(1),
(2), (4) Date: Jul. 23, 2004

(87) PCT Pub. No.: WO03/065781

PCT Pub. Date: Aug. 7, 2003

(65) Prior Publication Data

US 2005/0083654 A1    Apr. 21, 2005

(51) Int. Cl.
*H05K 7/20* (2006.01)
(52) U.S. Cl. ............... 361/699; 361/700; 361/701; 361/724; 62/259.2; 62/259.4; 165/104.33; 165/104.34
(58) Field of Classification Search ............... 361/687, 361/698, 699, 700, 701, 724; 62/259.2, 259.4; 165/104.33, 104.34; 257/714; 312/236, 312/223.2, 223.3
See application file for complete search history.

(56) References Cited

U.S. PATENT DOCUMENTS

| | | | | |
|---|---|---|---|---|
| 4,546,619 A | * | 10/1985 | Rohner | 62/419 |
| 4,729,424 A | | 3/1988 | Mizuno et al. | |
| 5,174,364 A | * | 12/1992 | Mizuno | 165/301 |
| 5,323,847 A | * | 6/1994 | Koizumi et al. | 165/104.33 |
| 5,365,749 A | * | 11/1994 | Porter | 62/259.2 |
| 5,966,957 A | | 10/1999 | Malhammar et al. | |
| 6,285,548 B1 | | 9/2001 | Hamlet et al. | |
| 6,854,514 B1 | * | 2/2005 | Sloan et al. | 165/206 |
| 2001/0042616 A1 | * | 11/2001 | Baer | 165/299 |
| 2003/0030981 A1 | * | 2/2003 | Zuo et al. | 361/699 |

FOREIGN PATENT DOCUMENTS

| EP | 0766308 A2 | | 4/1997 |
|---|---|---|---|
| JP | 352058147 A | * | 5/1977 |
| KR | 2001108738 A | * | 12/2001 |

OTHER PUBLICATIONS

Swidish Patent Office, International Search Report for PCT/SE02/00148, dated Aug. 28, 2002.

* cited by examiner

*Primary Examiner*—Michael Datskovskiy

(57) ABSTRACT

A novel electronics cooling method and system is disclosed. A very flexible and efficient operation of an electronics cooling system (10) is achieved by controlling circulation of a cooling medium in a closed system (40) containing an evaporator (13), a condenser (14), an ejector (11) and control valves (15–18). Specifically, the system is continuously allowed to operate in the most appropriate mode by controlling the valves (15–18) of the system (10) based on detected heat load and/or detected heat transfer conditions. By automatically adapting the mode of operation of the system based on the actual prevailing conditions, a unique flexibility is obtained with regard to the cooling mode in which the system will be operated. This means that the cooling capacity will be constantly optimized and that the investment cost as well as the cost for operating the system will be reduced compared to known systems having equal maximum cooling capacity.

21 Claims, 8 Drawing Sheets

CABINET COOLING

TECHNICAL FIELD

The present invention generally concerns methods and systems for cooling cabinets containing heat producing electronic equipment.

BACKGROUND

An important factor in the design of hardware, is the provision of adequate cooling of the electronic components employed therein. This is especially the case when designing hardware for use within the modem telecom and datacom industries. In this area it is an absolute requirement that the electronic components that are normally integrated in a cabinet are maintained at normal temperatures. Failure to do so will at least impair the operation and/or functionality of components or even cause them to fail completely.

Additionally, energy consumption during the life cycle of electronic products has the most important environmental and economical impact. Lower energy consumption is a strong sales argument and will be even more important in the future. Energy cost for cooling the electronics during ten-fifteen years is comparable with the unit's purchase price. The ability to keep the temperature of components at the permissible level is a main reason for thermal management. Up until now, telecom cabinets have been successfully cooled by means of forced air cooling, which is a well proven and reliable method that has been used for many years to maintain acceptable temperatures. However, the forced air cooling method suffers from inherent limitations. One such limitation is that the forced air cooling apparatus of today cannot normally handle more than a maximum of approximately 3–5 kW power dissipation per cabinet, depending on the size of the cabinet and/or the power density. In the new generations of telecom and datacom equipment, higher levels of heat flux will make the air cooling methods quite inadequate and will require more efficient cooling solutions. The next generation systems will be further miniaturized, leading to higher power density. Furthermore, they will be higher speed systems with increased power and capacity/performance. All this adds up to increased power dissipation in the form of heat that needs to be handled. Especially for outdoors Radio Base Stations (RBS), other alternative cooling system must be used, e.g. liquid cooling units.

In order to be able to remove heat in the excess of 3–5 kW per cabinet other traditional cooling methods will normally be recommended, such as liquid cooling with or without phase change, thermosyphon or compressor cooling. Thus, it is well known within the art to use traditional compressor cooling systems for cooling air that is in turn used to cool the electronic equipment, such as for in-house telecom and datacom systems. Such electronics cooling systems are in essence based on compressor air-condition systems that are quite expensive and require a great deal of energy, which also is negative from the environmental point of view. Expressed otherwise, the compressor cooling systems have the disadvantage of a low overall coefficient of performance.

Among other frequently used methods of cooling cabinets containing heat dissipating electronic equipment shall be mentioned thermosyphon cooling, having the advantage of requiring no additional energy for its operation. However, today's thermosyphon systems are rather expensive, at least in relation to their limited capacity when it comes to higher heat loads and/or higher ambient temperatures. Further alternatives that are used for cooling equipment containing heat dissipating electronic equipment, such as lasers or magnetic cameras, are i.e. liquid metal cooling and cryogenic cooling.

RELATED ART

A system related to the traditional compressor refrigeration system is the ejector type refrigeration system employing an ejector in the place of the compressor. This system ranges back all the way to the $19^{th}$ century when it was used in combination with the steam engine, since this system traditionally can make use of waste heat as drive energy, in order to lower the costs. For the same reason it has been frequently used as heat pump in combination with solar energy facilities as well as for air conditioning systems in automobiles. A common problem with all such ejector refrigeration systems has been the poor heat factor of the ejector heat pump, resulting in a likewise poor performance. However, lately much research has been performed with the aim of designing more efficient ejectors intended for use as heat pumps in air conditioners for buildings. So far no real breakthrough has been made and many known ejector systems are designed to be operated by waste heat, such as excess heat from solar energy facilities, and to operate at supersonic speeds. One example of such efforts is known through U.S. Pat. No. 5,647,221, directed to what is referred to as a pressure-exchange ejector—contrary to a conventional steady-flow ejector—that allegedly provides clearly improved performance. A major drawback of this solution is the increased complexity of the ejector having moveable parts, namely a miniature rotor intended to perform the actual pressure exchange.

SUMMARY

The invention overcomes the above problems in an efficient and satisfactory manner.

A general object of the invention is to provide an improved method of cooling a cabinet containing heat dissipating electronic components. In particular, it is an object of the invention to provide a cooling method being able to handle high heat loads very efficiently, at comparatively low cost and with minimum power consumption.

Briefly, the above object is achieved by controlling the circulation of a cooling medium in a closed system containing an evaporator, a condenser, an ejector and control valves. Specifically, this object of the invention is accomplished by providing controlling the valves of the system based on a detected heat load in the cabinet and/or on detected heat transfer conditions, thereby continuously allowing the system to operate in the most appropriate mode. Expressed otherwise, the invention provides an automatic adaptation of the mode of operation of the system based on the actual prevailing conditions, so that a unique flexibility is obtained with regard to the cooling mode in which the system will be operated. This means that the cooling capacity will be constantly optimized and that the cost, both with regard to the investment and to the operation of the system, will be reduced compared to known systems having equal maximum cooling capacity.

During moderate heat load conditions and normal heat transfer conditions the system will be automatically controlled for optimum performance under those detected conditions. Specifically, in this case forced circulation of the cooling medium is interrupted and the appropriate valves are set in a closed or open condition, respectively to place the cooling system in a "thermosyphon" cooling mode. In this thermosyphon cooling mode cooling medium is allowed to flow from the condenser to the evaporator where the cooling medium is vaporized, and vaporized cooling medium from the evaporator is allowed to flow to a secondary side of an ejector and freely back to the condenser. No external power is consumed by the system in this cooling mode.

Another mode of operation of the cooling system is automatically initiated under detected higher heat load conditions. In this case, the system is shifted to a combined liquid cooling with phase change for maintaining optimum performance under the changed conditions. Cooling medium is allowed to flow from the condenser to the evaporator and forced circulation of the cooling medium is now activated to pump cooling medium from the evaporator to a primary side of an ejector and back to the condenser. The power consumption for the forced circulation is in this case very reasonable in relation to the total cooling load.

When detecting heat load conditions near or at a maximum a control unit initiates a further mode of operation. Such conditions will cause automatic activation of an ejector cooling mode comprising vacuum compression by means of an ejector. Once more, this will maintain optimum performance under the changed conditions. This cooling mode will comprise forced circulation of the cooling medium and will allow a restricted flow of cooling medium from the condenser to the evaporator where the cooling medium is vaporized. The restricted flow is controlled based on the detected conditions, allowing the remainder of the cooling medium flow from the condenser to be circulated to a primary side of the ejector under a low positive pressure. A negative pressure is created at a secondary side of the ejector to pump vaporized cooling medium from the evaporator for condensation. In this way a very cost effective operation of the cooling system will be achieved through low energy consumption as well an extended optimization of the system performance.

In accordance with further embodiments of the ejector cooling mode the pressure delivered by the forced circulation is controlled based on the detected conditions, and a pressure difference and a temperature gradient between evaporator and condenser are regulated by controlling a restrictor valve providing the restricted flow from the condenser to the evaporator to continuously provide optimal cycle conditions.

By the employment of a specific low pressure ejector vaporized cooling medium is compressed and partly condensed in the ejector before returning to the condenser for further condensation.

Another object of the invention is to provide an improved system for cooling a cabinet containing heat dissipating electronic components. In accordance with the invention, this further object is achieved by means of a unique cooling system comprising a closed fluid system connecting a condenser, an evaporator, a fluid circulation means and a low pressure ejector through a series of controlled valves. The system further comprises a control unit for continuously controlling the positions of the valves in dependence on the prevailing operating conditions detected by temperature sensors.

These and further objects of the invention are met by the invention as defined in the appended patent claims, in which further preferred embodiments of the different aspects of the invention are also specified.

The present invention provides essential advantages over the state of the art by providing a cooling method and system that is:

Extremely flexible by providing continuous automatic shifting between different cooling modes being optimized for the different operating conditions:

Very cost effective and also environmentally friendly by being energy-saving and allowing the use of e.g. water or alcohol as working medium;

Fully operable using simple control; and

Optimally adapted to electronics cooling; e.g. by providing

Good possibility for redundancy.

Other advantages offered by the present invention will be readily appreciated upon reading the below detailed description of embodiments of the invention.

BRIEF DESCRIPTION OF THE DRAWINGS

The invention, together with further objects and advantages thereof, may best be understood by making reference to the following description taken together with the accompanying drawings, in which.

DETAILED DESCRIPTION OF EMBODIMENTS

Figure 1:
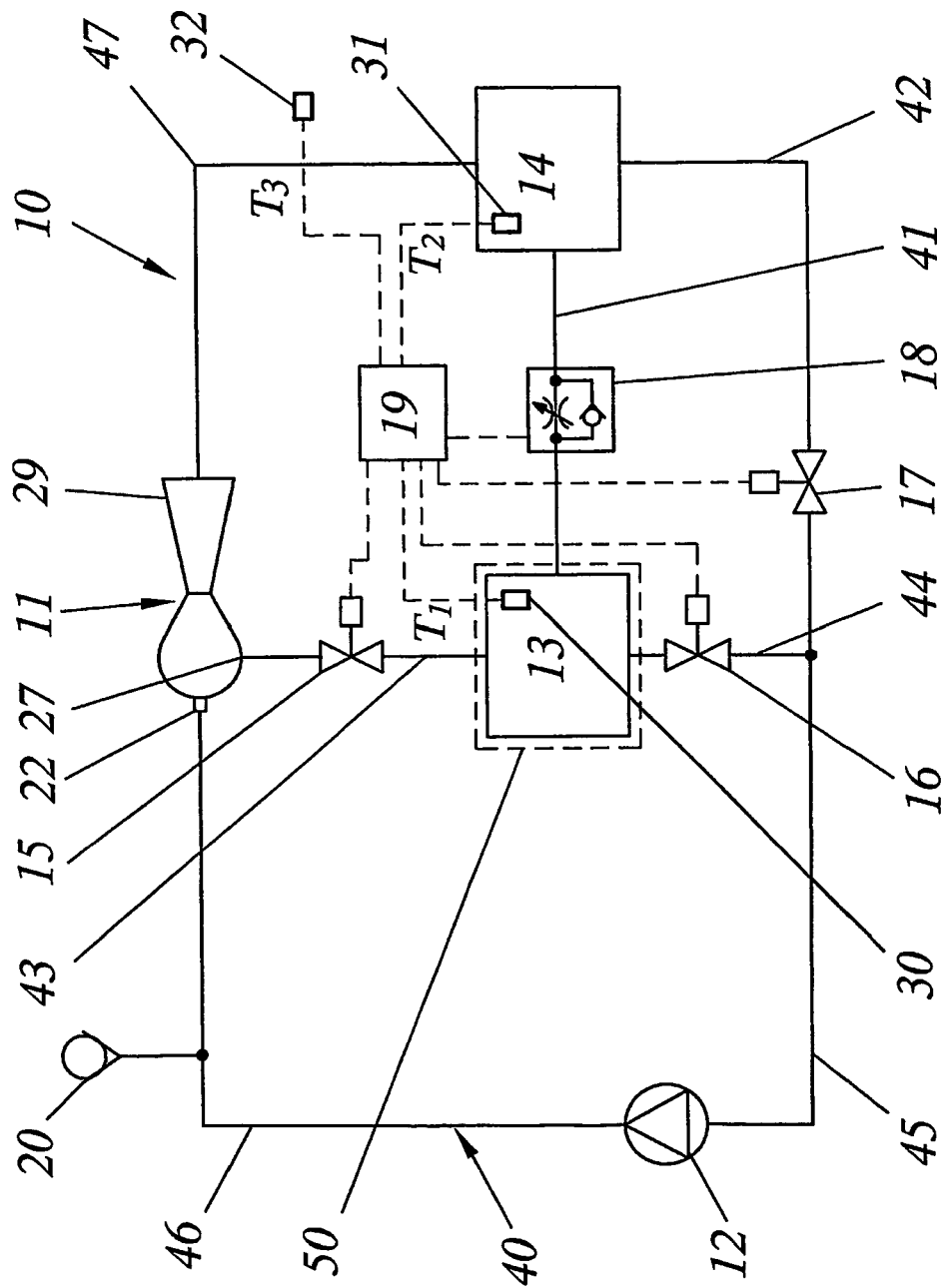
FIG. 1 is a schematic illustration of an embodiment of the cooling system according to invention.

The basic principles of the invention shall now be described by means of an embodiment of a cooling system 10 for performing the suggested method of cooling a cabinet 50 containing heat dissipating electronic components. The electronic components may be in the form of printed board assemblies PBA, see FIGS. 5A and 5B, or others. Within this specification the expression "printed board assembly" refers to a printed circuit board with modules and/or components mounted thereon. The general layout of said system is schematically illustrated in FIG. 1. The cooling system 10 is closed or hermetic and filled with a liquid cooling medium that may also be referred to as a refrigerant. Suitable cooling mediums for use with this system are e.g. water, alcohol, ammonia, benzol or other environmentally friendly medium having a vaporizing temperature of 25–100° C. at a slight subatmospheric pressure or at atmospheric pressure.

The system comprises a condenser/heat exchanger unit 14 provided outside the cabinet 50, an evaporator 13 provided in the cabinet 50, a standard fluid pump 12 and an ejector 11, being mutually connected through a basic fluid line system 40. Specifically, the fluid line system 40 connects an outlet side of the condenser 14 with an inlet side of the evaporator 13 and with the inlet or suction side of the fluid pump 12 by means of separate fluid lines 41 and 42, 45, respectively, and through first and second controlled valves 18 and 17, respectively. The outlet side of the evaporator 13 is connected to a secondary or passive medium side 27 of the ejector 11 and to the fluid pump 12 inlet side by means of separate fluid lines 43 and 44, 45, respectively, and through third and fourth controlled valves 15 and 16, respectively. The outlet or pressure side of the fluid pump 12 is connected to a primary or active medium side 22 of the ejector 11 by means of fluid line 46 and the outlet 29 of the ejector 11 is connected to an inlet side of the condenser 14 by means of fluid line 47. Fluid line 46 is in communication with a safety valve or expansion tank 9.

The valves 18, 17, 15, 16 are all controlled via a control unit 19 based on temperature readings $T_1$, $T_2$ and $T_3$ supplied to the control unit 19 from temperature sensors 30, 31 and 32, respectively, detecting the evaporator, condenser and ambient temperatures, respectively. The control unit 19 and the specific control equipment used therein are not disclosed in detail since the design of an appropriate control unit serving the purposes of the invention lies within the skill of the ordinary practitioner. The second, third and fourth valves 17, 15 and 16 are directional valves that are normally operated between fully open and fully closed positions. The first valve 18 is a one-way restrictor or throttle valve being controlled to allow a variable flow of cooling medium from the condenser 14 to the evaporator 13 but blocking backflow from the evaporator 13 to the condenser 14.

Embodiments of the evaporator 13 or evaporator chamber will be described further below with specific reference to FIGS. 5A, 5B and 7, whereas a preferred embodiment of an ejector 11 for use in the system 10 will be described in detail with reference to FIG. 6. The condenser 13 and its associated heat exchanger, not shown, are preferably based on conventional technique and their specific design will not be disclosed in detail.

The general operation of the system 10 will now be described. Cooling medium is circulated in the hermetic fluid line system 40 to absorb heat in the evaporator 13 and to transfer the absorbed heat from the cabinet and to emit said heat in the condenser/heat exchanger 14, as is quite conventional. However, the invention provides a novel electronics cooling with increased efficiency, reduced energy consumption and also with a higher level of functionality. This is achieved on the one hand by the unique provision of the evaporator 13 in the cabinet 50, immediately adjacent the heat generating components, and on the other hand by operating the described cooling system 10 in accordance with a combination of different modes that are based on separate cooling methods operating according to principles that are known in themselves. Specifically, this is achieved by detecting the evaporator temperature $T_1$ inside the cabinet 50 to determine the heat load on the system 10 and by also detecting the ambient temperature $T_3$ and the condenser temperature $T_2$ to determine the conditions of the heat transfer from the cooling medium to the surroundings or through the heat exchanger, not shown. The circulation of the cooling medium is controlled based on the detected heat load and the detected ambient temperature and heat transfer. The flow of cooling medium from the condenser 14 and back to the evaporator 13 in the cabinet 50, after transfer of heat from the cooling medium, and activation/deactivation of a vapor compression cycle performed by means of the ejector 11, is likewise controlled based on the detected heat load and the detected ambient temperature and heat transfer conditions. This method provides for a controlled shifting between cooling of the cabinet in a thermosyphon cooling mode, a liquid cooling mode or an ejector cooling or heat pump mode.

Figure 2:
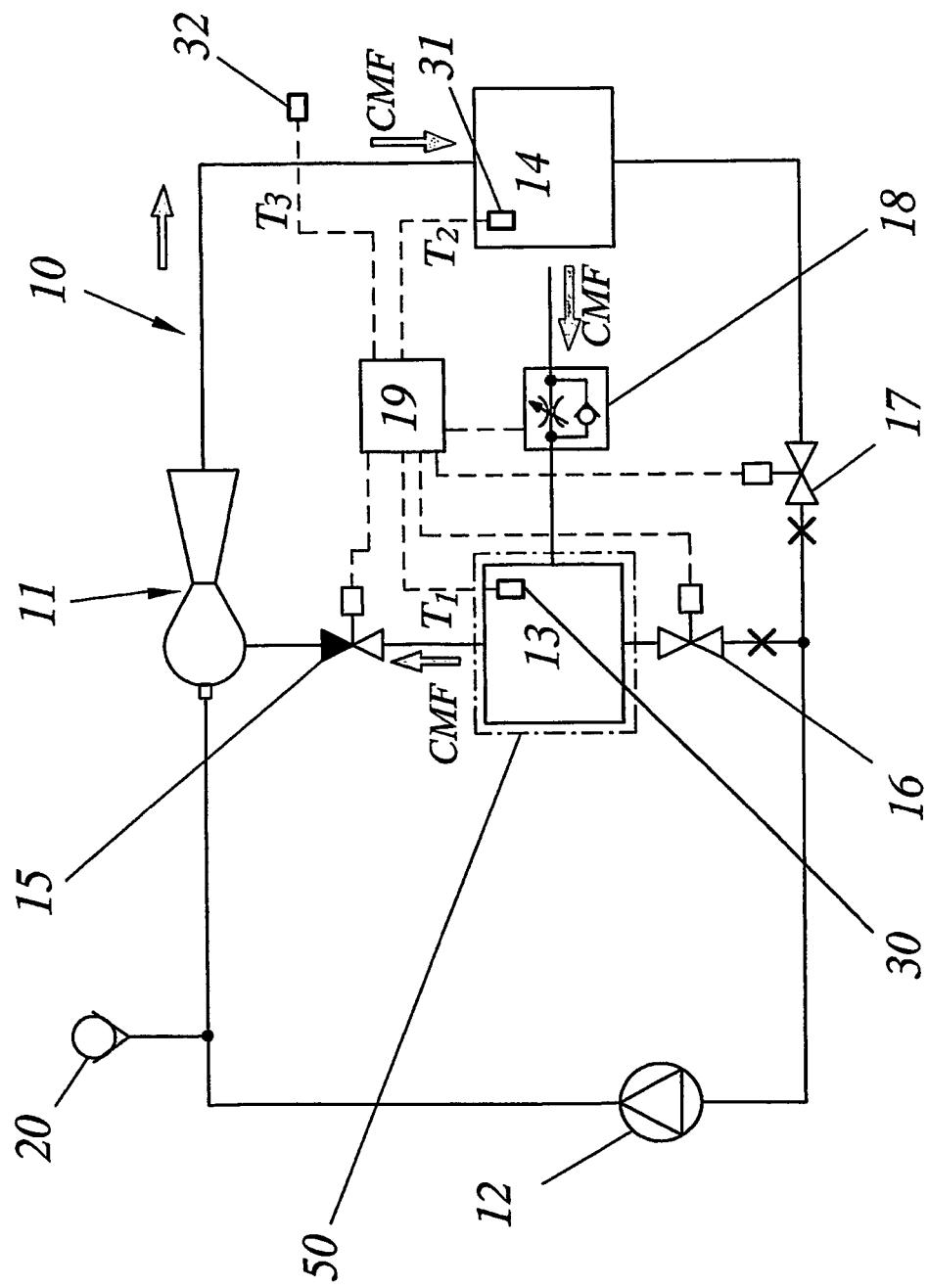
FIG. 2 is a schematic illustration of the embodiment of the cooling system according to FIG. 1, operating in a thermosyphon mode.
Figure 3:
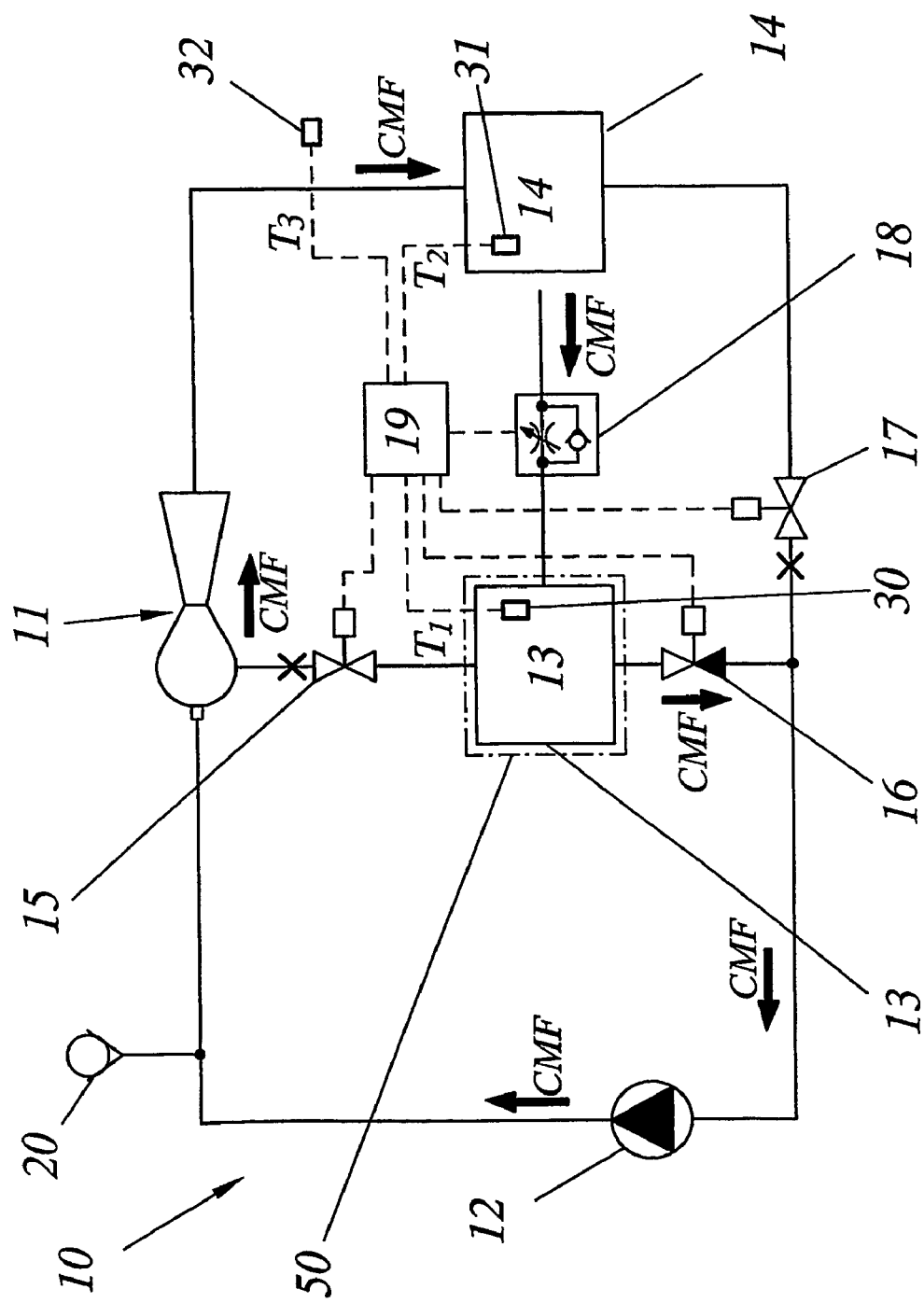
FIG. 3 is a schematic illustration of the embodiment of the cooling system according to FIG. 1, operating in a liquid cooling mode.
Figure 4:
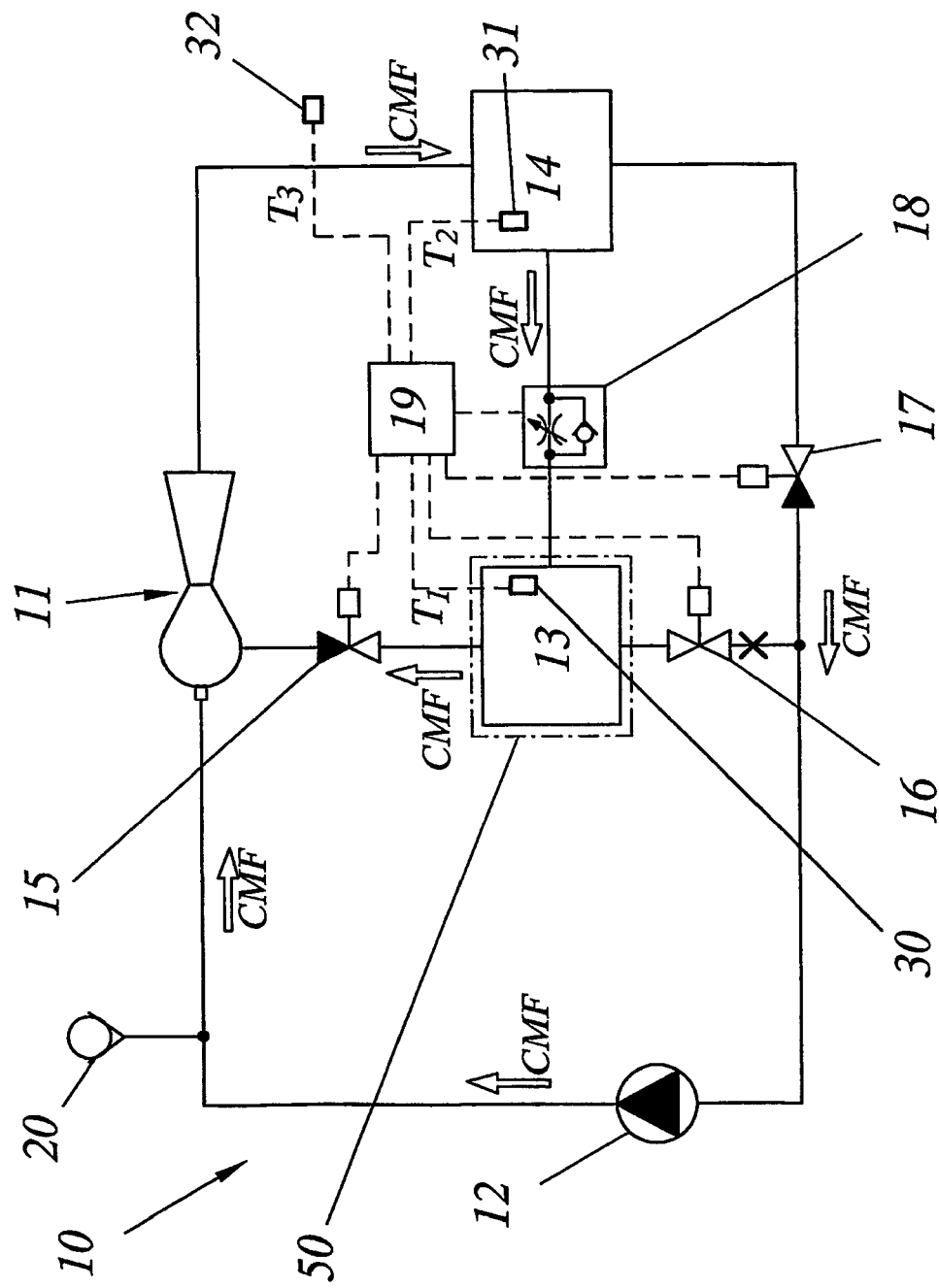
FIG. 4 is a schematic illustration of the embodiment of the cooling system according to FIG. 1, operating in an ejector cooling mode.

A discussion of the suggested inventive method of operating the system in either of three main modes of operation follows below. The operation in the three modes, namely the thermosyphon cooling mode (FIG. 2), the liquid cooling mode (FIG. 3) and the ejector cooling mode (FIG. 4) is illustrated in FIGS. 2–4, where arrows CMF indicate the cooling medium flow in the different modes.

During moderate cabinet heat load conditions (FIG. 2) and normal heat transfer conditions, when the evaporator temperature sensor 30 detects an evaporator temperature $T_1$ below a set first level and the ambient temperature sensor 32 detects a temperature $T_3$ below a set level (such as below approximately +30° C.), the control unit 19 will automatically control the system 10 for optimum performance under the detected conditions. Specifically, in this case the control unit 19 will stop the fluid pump 12 to interrupt the forced circulation of the cooling medium. Simultaneously, the valves 16 and 17 are closed, whereas valves 15 and 18 are set in open condition to place the system 10 in a "thermosyphon" operation mode. In this thermosyphon operation mode, the first valve 18 is open for transporting the cooling medium from the condenser 14 to the evaporator 13 but is closed in the opposite direction.

The full flow of the cooling medium from the condenser 14 outlet side is returned to the evaporator 13 where the cooling medium is vaporized at e.g. 50° C.; and the full flow of vaporized cooling medium from the evaporator 13 is conducted to the secondary side 27 of the ejector 11, through the ejector and from an ejector diffuser outlet 29 back to the condenser 14. Since the forced circulation of the cooling medium is stopped, no primary cooling medium enters the ejector 11 and no vapor compression is performed therein. Instead, cooling medium vapor/gas from the evaporator 13 drains freely through the ejector. In the condenser 14, the transferred vapor condenses at roughly the same temperature (e.g. 50° C.) and the heat is transferred to the surroundings (e.g. the ambient air) through a heat exchanger, not illustrated. The temperature gradient between the surroundings/ambient air and the condenser 14 is in this case approximately 15–30° C.

The control unit 19 initiates a second mode of operation (FIG. 3) when detecting higher heat load conditions in situations where the environment temperatures are substantially the same. In this case, when the evaporator temperature sensor 30 detects an evaporator temperature $T_1$ higher than the predetermined first level but lower than a predetermined second level and the ambient temperature sensor 32 detects a temperature $T_3$ below the set level, a combined liquid cooling with phase change is automatically activated for maintaining optimum performance under the changed conditions. The forced circulation fluid pump 12 is now activated to start pumping cooling medium to the ejector 11 primary side 22. The power consumption for operating the pump 12 is in this case estimated to be at the most 5% of the total cooling load.

In this mode, the valves 15 and 17 are closed, whereas valves 16 and 18 are set in open condition to place the system 10 in a liquid cooling mode. In this mode the full flow of cooling medium from the condenser 14 outlet side is returned to the evaporator 13, where a portion of the refrigerant or cooling medium is vaporized at e.g. 50° C. Since the pump 12 is activated and the fourth valve 16 is fully open cooling medium and vapor from the evaporator 13 is pumped to the primary side 22 of the ejector 11, through the ejector and to the condenser 14.

Since the forced circulation of the cooling medium is activated and the entrance to the secondary side 27 of the ejector 11 is blocked by the closed third valve 15 the full flow of cooling medium in a liquid and a vapor phase is pumped through the ejector primary side 22 to the condenser 14 where the transferred vapor condenses at roughly the same temperature (e.g. 50° C.) and the heat is emitted to the surroundings through the heat exchanger. The temperature gradient between the surroundings/ambient air and the condenser 14 is in this case also approximately 15–30° C.

A third mode of operation (FIG. 4) is initiated by the control unit 19 when detecting maximum heat load conditions and/or high ambient temperatures above the set limit, e.g. 35–50° C. In this situation the evaporator temperature sensor 30 detects an evaporator temperature $T_1$ that is higher than a predetermined second level and/or the ambient temperature sensor 32 detects a temperature $T_3$ exceeding the set level. This will cause automatic activation, through the control unit 19, of an ejector or heat pump cooling mode in which vacuum compression is obtained by means of the ejector 11. Once more, this will maintain optimum performance under the changed conditions. The forced circulation fluid pump 12 is activated to start pumping cooling medium to the ejector 11 primary side 22. The fourth valve 16 is closed to block direct connection between the evaporator outlet side and the pump, whereas the second and third valves 17 and 15, respectively, are fully open.

The first valve 18 is operated as a one-way restrictor valve or throttle valve providing a restricted flow of cooling medium from the condenser 14 outlet side to the evaporator 13 inlet side where the cooling medium is vaporized. Through the control unit 19, the restricted flow through the first valve 18 is controlled based on the detected evaporator temperature $T_1$ and/or on the detected ambient temperature $T_3$.

The remainder of the flow of cooling medium from the condenser 14 is circulated to the primary side 22 of the ejector 11 by the fluid pump 12 under a certain positive pressure, thereby creating a negative pressure at the secondary side 27 of the ejector. Since the third valve is open, establishing communication between the evaporator and the ejector secondary side, this created negative pressure will cause the vaporized cooling medium to be pumped out from the evaporator 13 to the secondary side 27 of the ejector 11. The cooling medium vapor is compressed in the ejector 11 through contact with the primary cooling medium flow, as will be described further below. Part of the compressed vapor condenses inside the ejector 11, at the diffuser 29, and moves directly to the condenser 14 where condensation of the remaining vapor occurs.

A pressure difference $P_1-P_2$ (see FIG. 7) and a temperature gradient $T_1-T_2$, respectively, between evaporator 13 and condenser 14 is regulated by controlling the degree of restriction of the one-way restrictor 18, to thereby provide optimal cycle conditions in relation to the detected heat load and ambient temperature $T_3$. A minor part of the cooling medium is passed through the restrictor valve 18, being equal to the amount of liquid that is vaporized. The major part of the cooling medium is circulated from the condenser 14 via the second valve 17, pump 12 and ejector 11 and back to the condenser to create a vapor compression cycle similar to that of a heat pump.

The pressure delivered by the fluid pump 12 is also controlled based on the detected evaporator temperature $T_1$ and/or on the detected ambient temperature $T_3$. By increasing the hydraulic pressure of the pump, the ejector capacity to pump out and condense vapor increases. As an example, the evaporator temperature $T_1$ is 50° C., and the condenser temperature $T_2$ is between 55° C. and 100° C. The greater the difference in temperature $T_1-T_2$, the higher operating power is needed. At smaller heat load and lower environmental temperatures the system will automatically return to operate in the described thermosyphon or liquid cooling mode.

By means of the invention as described above, it will now be possible to continuously adapt the operation of the system to the prevailing conditions. According to the invention, this will be possible with one and the same cooling unit or system, which may be operated as three different cooling systems. It will be possible to choose the type of operation that is most suitable and that may cool electronics with the lowest energy consumption. In other words, the application of the disclosed features of the invention will not only provide a very flexible and adaptable cooling solution but will also combine and utilize the best properties of thermosyphon cooling, liquid cooling and ejector cooling in one and the same unit. The efficiency of the proposed cooling method and system will be achieved by continuously and automatically selecting the cooling mode that operates most efficiently under the existing conditions. To clarify this a summary of the properties of the different cooling modes is presented below, in Table 1. For comparison, the corresponding properties of a conventional compressor cooling cycle are also given in Table 1.

TABLE 1

| Parameter/property | Liquid/Water cooling | Thermosyphon cooling | Ejector cooling | Compressor cooling |
|---|---|---|---|---|
| Heat transfer coefficient, W/(m²K) | Maximum 20000 | Maximum 40000 | Maximum 40000 | Maximum 40000 - evaporator; 50 - air cooling |
| Automatic control | Decent | Weak | Good | Poor |
| Power consumption, % of cooling capacity | 5–10 | 0–5 | 10–40 | 20–50 |
| Redundancy options | Decent | Weak | Good | Weak |
| Investment cost (Range of 0–10) | 6–9 | 8–10 | 7–10 | 10 |
| Cooling medium temperature gradient ° C.[1] | 10–20 | 0–5 | 0–50 | 50–80 |
| External | 20 | 20 | 30–40 | 30–40 |

TABLE 1-continued

| Parameter/property | Liquid/Water cooling | Thermosyphon cooling | Ejector cooling | Compressor cooling |
|---|---|---|---|---|
| temperature gradient °C.[2] | | | | | where:
[1]= Difference between highest and lowest temperatures of cooling medium.
[2]= Difference between highest temperature of cooling medium and ambient temperature.

Ejector cooling systems are not new as such, but have mainly employed high pressure ejectors powered by waste heat or other energy sources. Such systems have been used in particular for air-conditioning units in automobiles. The suggested introduction of the low pressure ejector system for electronics cooling will provide new functionality for cooling systems that in one and the same system can be operated as a thermosyphon cooling system, as a liquid cooling system or as heat pump cooling system depending on the cooling requirements. For different electronics applications, such as for outdoors Radio Base Stations (RBS) and also for in-house telecom and datacom systems the mode of operation that best suits the prevailing circumstances will be chosen. For example, a combination of a liquid and an ejector cooling system or a combination of a thermosyphon and an ejector cooling system, or only an ejector system, may be chosen. The final choice criteria should be the total cost for the cooling system.

The system provides very flexible control through automatic control of the fluid pump and all of the valves. The use of a low pressure ejector vacuum pump 11 of the design illustrated in FIG. 6 will moreover provide a possibility to increase the refrigerating capacity by achieving a higher heat pump heat factor. Preliminary calculations show that compared to a conventional compressor driven refrigerating machine, the inventive system with the low pressure ejector will also be a more energy saving solution because of its lower temperature gradient between evaporator and condenser. It will also be cheaper and more reliable on account of the fact that no rotating parts are used therein. Such a system using the suggested type of ejector will permit the use of water or alcohol as working medium, which is very important from an environmental protection point of view. As mentioned above, such a use of an ejector system may reduce the temperature gradient between evaporator and condenser chambers and reduce both energy and investment cost for the whole cooling system.

In accordance with one aspect of the invention, a highly efficient low pressure ejector 11 performs the functions of a conventional vacuum pump/compressor. An example of an ejector of this general design is known through SU 1714216A1. The employed ejector 11 operates at low primary side positive pressure and is schematically shown in FIG. 6. The ejector 11 comprises a main distribution chamber 21 for receiving a primary or active cooling medium introduced therein through a primary cooling medium supply sleeve 22. In the distribution chamber is provided a multi-channel primary medium nozzle 23 in the form of a spherical segment having radial channels or nozzle holes 23A. These nozzle holes 23A open into a mixing chamber 24 that is connected to and communicates with a diffuser 29 through a neck or throat 28. The mixing chamber 24 is surrounded by a secondary or passive medium supply chamber 26 that communicates with the evaporator 13 through a supply sleeve 27. On the other hand, the secondary or passive medium supply chamber 26 communicates with the mixing chamber 24 through a plurality of secondary medium holes 25, provided in a wall 24A of the mixing chamber 24, for the introduction of the secondary or passive medium. A main feature of the ejector device 11 is that the inner cross-section area of the neck 28 that conducts cooling medium to the diffuser 29 is substantially equal to the total cross-section area of the nozzle holes 23A. The geometrical centre C of the spherical segment of the nozzle 23 lies on a mixing chamber center axis CA just behind or, expressed otherwise, immediately downstream from the throat or neck 28. The ejector is intended for use with a liquid primary or active medium and a vaporizing secondary or passive medium. In the embodiments described herein the same medium, such as water, is used both in the liquid and vaporized state.

The ejector 11 works in the following way: Through the primary cooling medium supply sleeve 22 water is fed into the distribution chamber 21 at a certain positive pressure. The multi-channel nozzle 23 having the generally spherical shape and being provided with the small radial nozzle holes 23A, forms a cone of converging jets CMJ as the water introduced into the distribution chamber 21 passes through the nozzle 23 and into the mixing chamber 24. Water vapor is sucked into the mixing chamber 24 through the secondary medium supply sleeve 27 and supply chamber 26 and the plurality of secondary medium holes 25. Through interaction between vapor molecules and water jets CMJ, vapor molecules begin to move towards the outlet throat 28 in parallel with the water jets CMJ. Since the water jets CMJ converge and finally merge, water vapor is compressed and condensed. This means that part of the kinetic energy of the water jets CMJ is consumed to compress and condense the vapor. A main characteristic of the ejector is that it may be operated both as a vapor compressor and a condenser. In accordance with the invention, this characteristic is preferably used in the described electronics cooling system. Generally, the inventive ejector cooling mode is optimally adapted to electronics cooling experiencing higher temperatures in the evaporator chamber (up to 65° C.). It provides possibilities for higher temperatures in the condenser (up to 110–130° C. if necessary, but mostly it will be sufficient with 75–80° C. when the ambient temperature is approximately 50° C.).

Figure 5A:
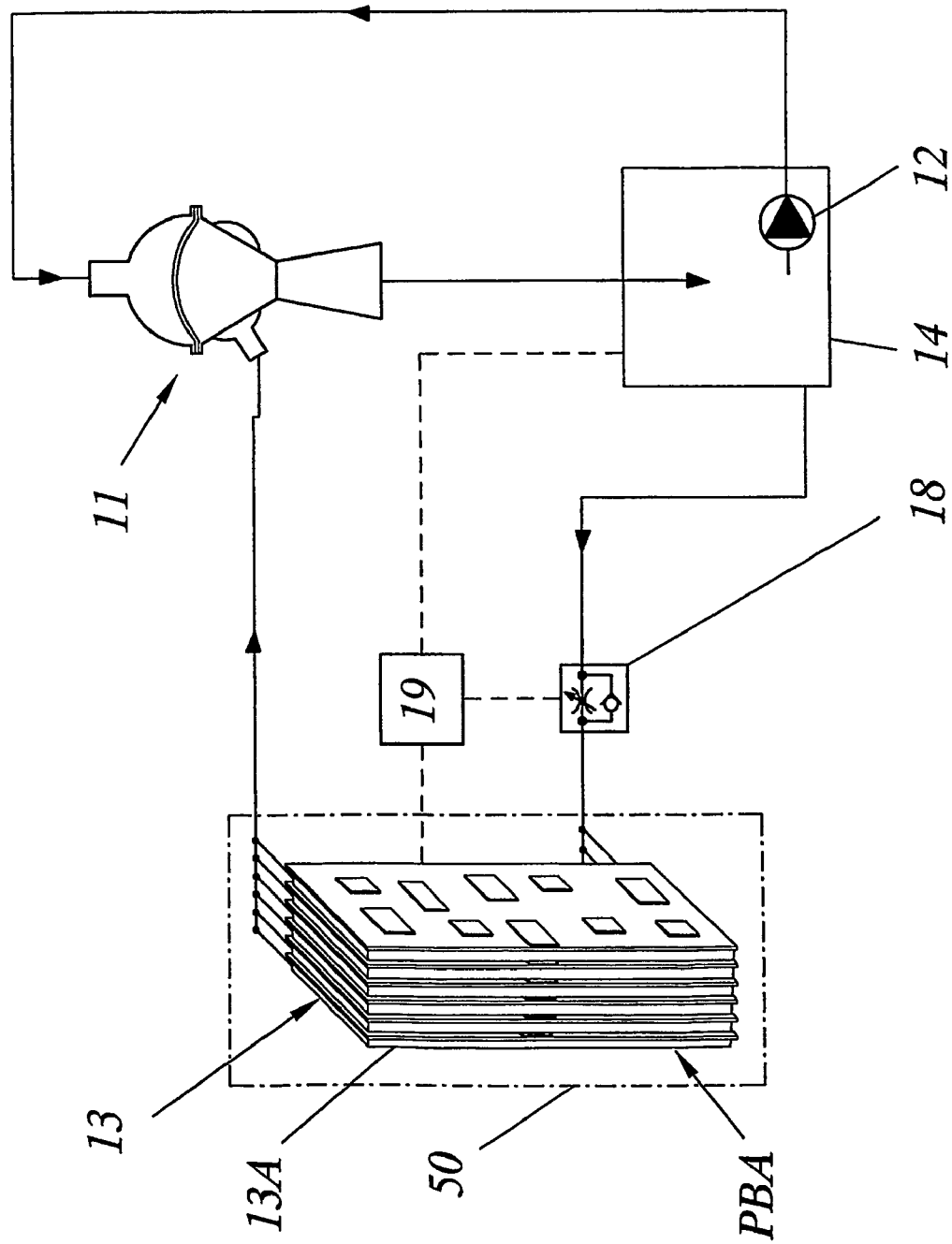
FIG. 5A is a schematic illustration of a practical embodiment of the cooling system of the invention, shown in the ejector cooling mode of FIG. 4.
Figure 5B:
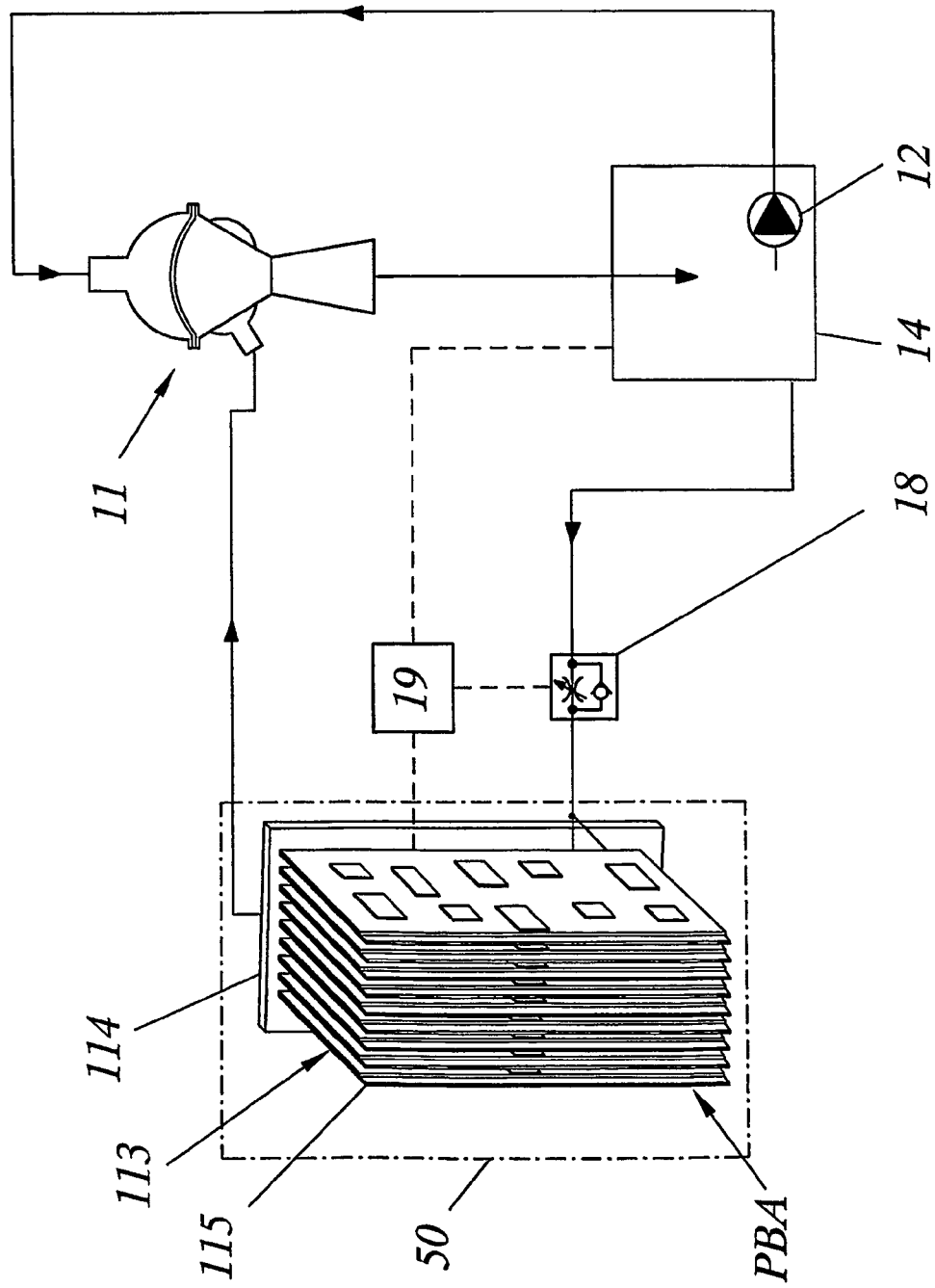
FIG. 5B is a schematic illustration of a further practical embodiment of the cooling system of the invention, shown in the ejector cooling mode of FIG. 4.
Figure 6:
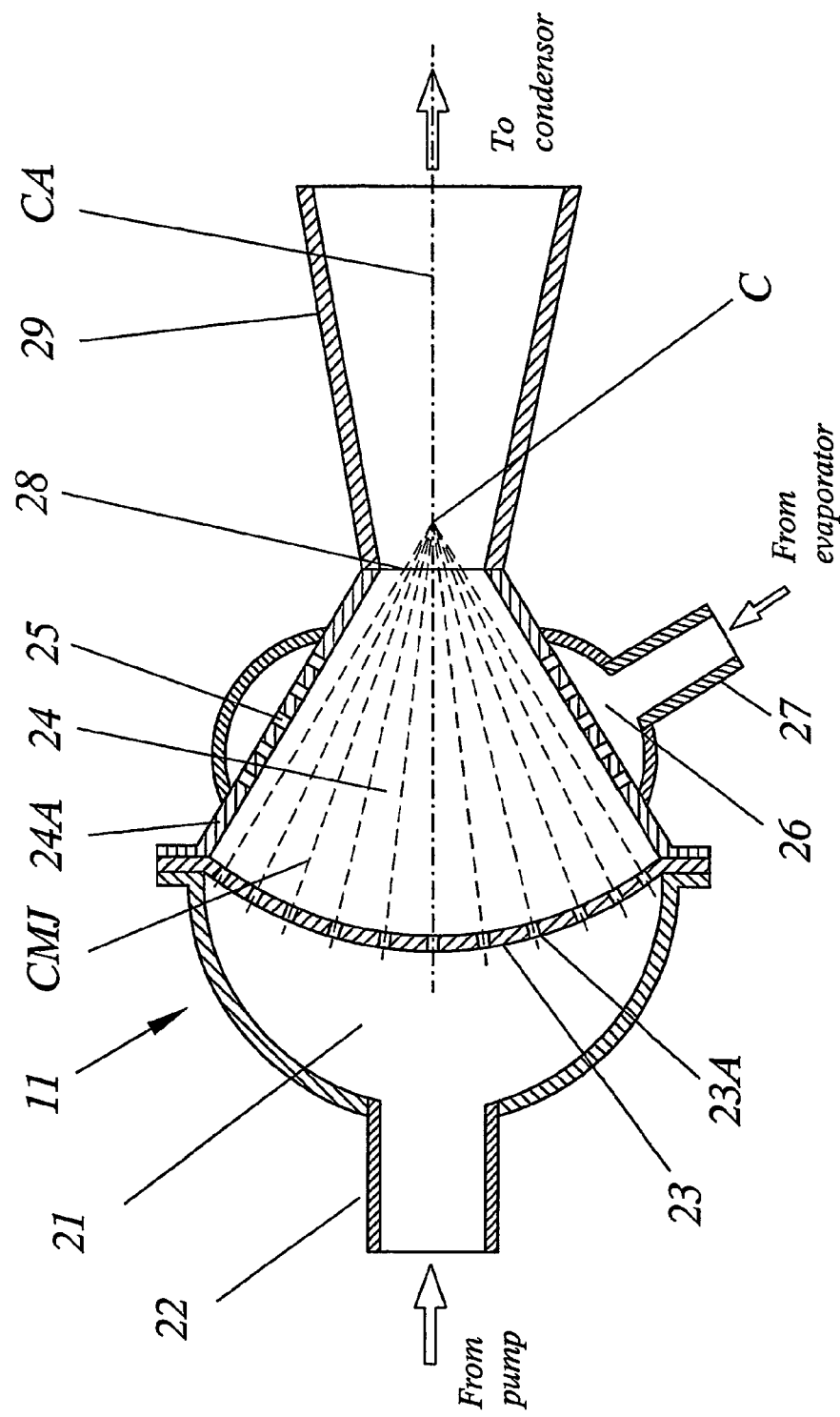
FIG. 6 illustrates an embodiment of an ejector for use in a cooling system according to the invention.

Reference is now made to FIGS. 5A and 5B that schematically illustrate two embodiments of practical evaporator solutions that may preferably be used in different applications of the system. FIG. 5A illustrates what might be referred to as a "direct cooling" evaporator 13 that consists of several evaporator heat sinks 13A. The heat sinks 13A each directly contact one or more of the electronic components PBA and preferably consist of vertically positioned thin metal plates, e.g. of aluminum, with built-in channels, not illustrated, for cooling medium. In this embodiment the cooling medium in the channels directly transfers heat from the electronic components PBA.

FIG. 5B is a schematic illustration of a "cold wall" evaporator unit 113. Here, the evaporator 113 comprises a cold wall 114 containing cooling medium and contacting one edge of several electronic components PBA. Transfer of heat from the electronic components PBA to the cold wall 114 cooling medium is performed through heat lines, heat pipes, not specifically illustrated, or aluminum plates (115). In such a design, evaporation occurs in the "cold wall".

Figure 7:
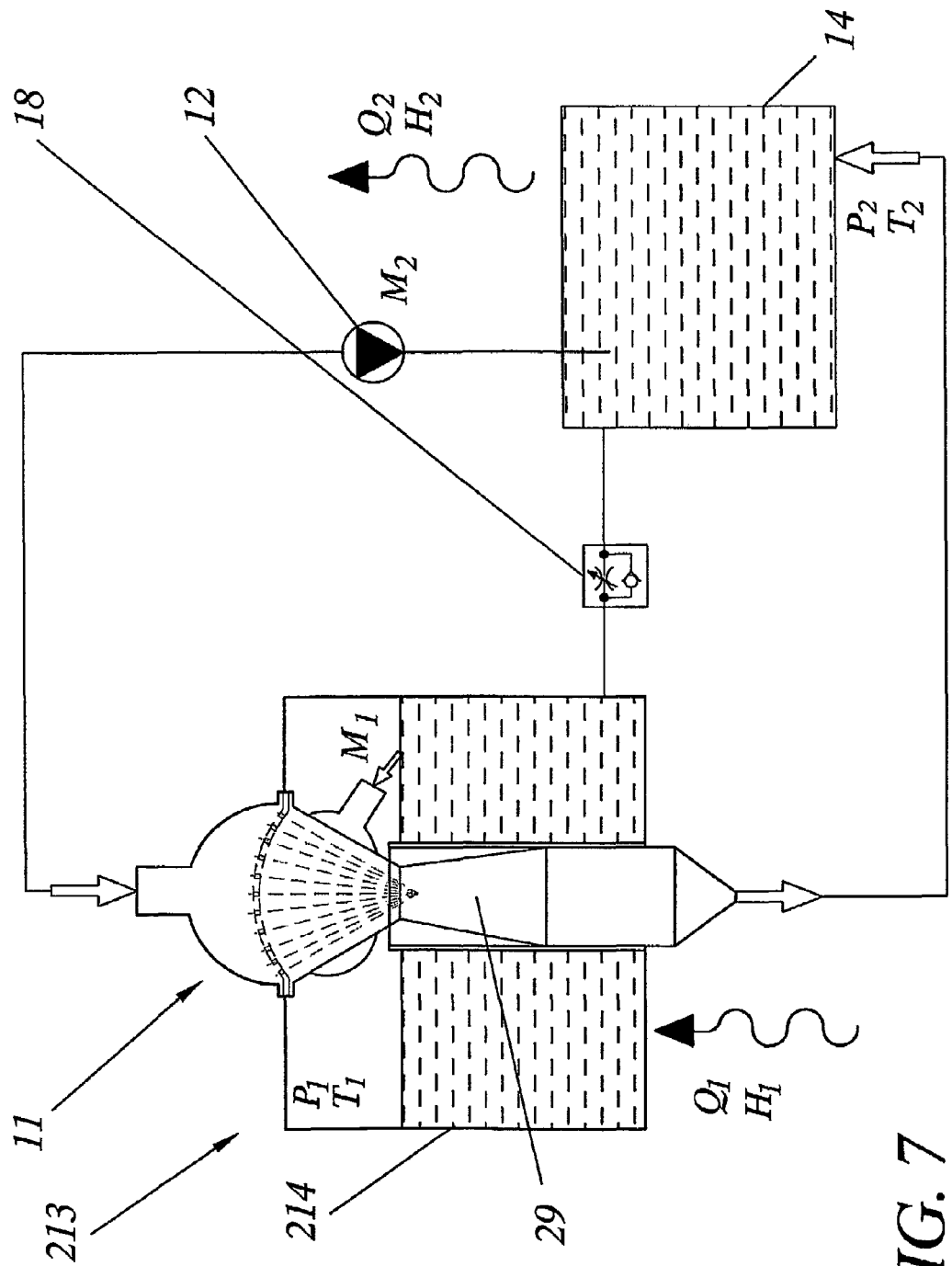
FIG. 7 is a schematic illustration of a theoretical heat and mass transfer balance by a further embodiment of the cooling system according to the invention, when operated in the ejector cooling mode.

Finally, FIG. 7 is a very schematic illustration of a further practical embodiment of the system according to the invention. In accordance with this embodiment the evaporator 213 has an evaporator chamber 214 and the ejector 11 of the system is integrated in said evaporator chamber 214. In a further development, not illustrated, the diffuser 29 of the ejector 11 may also be physically connected to the condenser 14 so that ejector, condenser and evaporator chamber are one integrated unit.

In order to provide a presentation of a theoretical heat and mass transfer balance by the inventive ejector cooling system, operation of the system will now be described with reference to FIG. 7. As hot electronic components are cooled, they give off heat $Q_1$ to evaporator chamber 214. In an illustrative example, boiling occurs at 70° C. and condensation at 80° C. A temperature $T_1$ of 70° C. in the evaporator chamber 214 should, theoretically, secure the temperature limit of 75–80° C. on the pins of components and a temperature of 80° C. should also create a decent condition for cooling the cooling medium in the condenser 14 (by air heat exchanger at 50° C. ambient temperature). If it is possible to store heat in some heat-storing unit (water heater, underground cavity etc.), it is possible to reduce the temperature in the condenser to 70–72° C. The whole system is filled with water, and has a pressure of P=0,31 bar.

In a first step, water heats up and starts to boil at 70° C. and at a pressure $P_2$=0,31 bar in evaporator chamber 214. In order to transmit $Q_1$=2000 W of heat power, an amount $M_1$ of about 0,9 gram of water per second should be boiled in evaporator chamber 214. In a second step, in order to transport vapor ($M_1$=0,9 gram/s) from the evaporator chamber 214, water pump 12 pumps water via ejector 11. In a third step, the generated vapor from evaporator chamber 214 is pumped out and condenses, after compression in the diffuser 29, in the condenser 14 under the pressure $P_2$=0,47 bar and at the temperature $T_2$ of 80° C. In a fourth step, water drains back to the evaporator chamber 214 (at $M_1$=0,9 g/s) from the condenser 14 via restrictor valve 18, and that step completes an ejector cooling cycle.

One of the most important parameters is the coefficient of cooling performance $K=Q_1/P_{el}$, where $P_{el}$ is the consumed electrical power. The energy needed to power the water pump 12 can be estimated preliminary, assuming that the spherical segment of the ejector nozzle 23 has 350 radial nozzle holes, each 1 mm in diameter. To reach up to 2 m/s of water velocity after the spherical segment, the water pump 12 must manage approximately 0,5 kg/s or 2 m³/h. A pressure drop of the system is calculated to be $\Delta P_{tot}=(P_2-P_1)+\Delta P_{hyd}$=2–3 bar where $\Delta P_{hyd}$ is the hydraulic resistance in the pipeline system 40 and the ejector 11. To manage that, a water pump 12 having an effect of about 500 W will be required. The coefficient of performance can be $K=Q_1/P_{el}$=2000/500=4.

It will be understood by those skilled in the art that various modifications and changes may be made to the present invention without departure from the scope thereof, which is defined by the appended claims.

The invention claimed is:

1. A method of cooling a cabinet containing heat dissipating electronic components (PBA), comprising the steps of:
   circulating cooling medium in a closed fluid system to absorb heat in an evaporator in the cabinet and to transfer the absorbed heat from the cabinet and to emit said heat outside the cabinet in a condenser/heat exchanger,
   detecting the evaporator temperature ($T_1$) inside the cabinet to determine the heat load on the system;
   detecting the ambient temperature ($T_3$) and the temperature ($T_2$) in the condenser to determine the conditions of the heat transfer from the cooling medium;
   controlling a forced circulation of the cooling medium based on the detected heat load and conditions of heat transfer;
   controlling the flow of the cooling medium back to the evaporator in the cabinet based on the detected heat load and conditions of heat transfer; and
   controlling the activation/deactivation of a vapor compression cycle based on the detected heat load and conditions of heat transfer;
   thereby allowing a controlled shifting between cooling of the cabinet in different cooling modes optimized for different heat load and heat transfer conditions.

2. The method according to claim 1, wherein when the detected heat load inside the cabinet is lower than a predetermined first level and/or the detected ambient temperature ($T_3$) is lower than a predetermined level,
   a fluid pump is deactivated for interrupting forced circulation of the cooling medium;
   the full flow of cooling medium from the condenser is returned to the evaporator where cooling medium is vaporized; and
   the full flow of vaporized cooling medium from the evaporator is conducted to a secondary side of an ejector through the ejector and from an outlet from the ejector back to the condenser;
   whereby the cooling of the cabinet is performed in a thermosyphon cooling mode.

3. The method according to claim 2, wherein the level of the ambient temperature ($T_3$) is approximately 30° C., in that cooling medium is vaporized at approximately 50° C. in the evaporator, and in that the cooling medium vapor condenses at substantially the same temperature in the condenser and emits heat, whereby the temperature gradient between the surroundings and the condenser is in the range of 15–30° C.

4. The method according to claim 3, wherein the cooling medium vapor from the evaporator is drained freely through the ejector and is condensed in the condenser.

5. The method according to claim 4 when the detected heat load inside the cabinet is higher than a predetermined first level but lower than a pre-determined second level and the detected ambient temperature ($T_3$) is lower than a pre-determined level,
   a fluid pump is activated for performing forced circulation of the cooling medium;
   the full flow of cooling medium from the condenser is returned to the evaporator; and
   cooling medium from the evaporator is pumped to a primary side of an ejector, through the ejector and to the condenser;
whereby the cooling of the cabinet is performed in a liquid cooling mode.

6. The method according to claim 5, the level of the ambient temperature ($T_3$) is approximately 30° C. in that a portion of the cooling medium vaporizes at approximately 50° C. in the evaporator and in that cooling medium vapor condenses at substantially the same temperature in the condenser and emits heat, whereby a temperature gradient between the surroundings and the condenser is in the range of 15–30° C.

7. The method according to claim 6, wherein entrance to a secondary side of the ejector is blocked and in that the full flow of cooling medium in a liquid and a vapor phase is pumped through the ejector primary side to the condenser.

8. The method according to claim 7 wherein when the detected heat load inside the cabinet exceeds a predetermined second level and/or the detected ambient temperature ($T_3$) is higher than a predetermined level,
a fluid pump is activated for performing forced circulation of the cooling medium;
a restricted flow of cooling medium is conducted from the condenser to the evaporator where the cooling medium is vaporized, the restricted flow being controlled based on the detected evaporator temperature ($T_1$) and/or on the detected ambient temperature ($T_3$);
the remainder of the flow of cooling medium from the condenser is circulated to a primary side of an ejector by the fluid pump, creating a negative pressure at a secondary side of the ejector; and
the vaporized cooling medium is pumped out from the evaporator to the secondary side of the ejector by the created negative pressure and is returned to the condenser; whereby the cooling of the cabinet is performed in an ejector cooling mode.

9. The method according to claim 8, wherein the pressure delivered by the fluid pump is controlled based on the detected evaporator temperature ($T_1$) and/or on the detected ambient temperature ($T_3$).

10. The method according to claim 9, wherein the vaporized cooling medium is compressed and partly condensed in the ejector by the pumped primary cooling medium, and is then conducted to the condenser for further condensation.

11. The method according to claim 10 wherein a pressure difference ($P_1-P_2$) and a temperature gradient ($T_1-T_2$), respectively, between evaporator and condenser is regulated by controlling a restrictor valve to provide optimal cycle conditions in relation to the detected heat load and ambient temperature ($T_3$).

12. A cooling system for cooling a cabinet containing heat dissipating electronic components (PBA), comprising:
means for circulating a cooling medium in a closed fluid system from a condenser/heat exchanger to an evaporator inside the cabinet and back to the condenser/heat exchanger;
at least one valve for controlling the flow of cooling medium between the condenser and the evaporator;
an ejector having a primary and a secondary side;
a fluid line system connecting the condenser to the evaporator and to a fluid pump, respectively, through first and second controlled valves and connecting the evaporator to the fluid pump and the ejector secondary side, respectively, through third and fourth controlled valves;
temperature sensors for detecting the evaporator temperature ($T_1$), for detecting the condenser temperature ($T_2$) and for detecting the ambient temperature ($T_3$), respectively; and
a control unit for controlling the positions of the valves in dependence on the detected temperatures.

13. The cooling system according to claim 12, wherein the first valve is a one-way restrictor valve blocking backflow from the evaporator to the condenser and controlled by the control unit to regulate cooling medium flow from the condenser to the evaporator.

14. The cooling system according to claim 13, wherein the ejector is a low pressure ejector operating at low primary side positive pressure and having a primary side distribution chamber for receiving the primary cooling medium and a multi-channel nozzle in the form of a spherical segment provided with radial nozzle holes leading into a mixing chamber that is surrounded by a secondary cooling medium supply chamber communicating with the mixing chamber through a plurality of supply holes and that is connected to a diffuser through a neck.

15. The cooling system according to claim 14, wherein the cooling medium conducting inner cross-section area of the neck is substantially equal to the total cross-section area of the nozzle holes and in that the geometrical centre (C) of the spherical segment of the nozzle lies on a mixing chamber center axis (CA), immediately downstream of the neck.

16. The cooling system according to claim 14, wherein the evaporator consists of several evaporator heat sinks each directly contacting one or more of the electronic components (PBA).

17. The cooling system according to claim 16, wherein the evaporator consists of thin metal plates with built-in water channels directly transferring heat from the electronic components (PBA).

18. The cooling system according to claim 15 wherein the evaporator comprises a cold wall containing cooling medium and contacting one edge of several electronic components (PBA) and in that heat transfer from the electronic components to the cold wall cooling medium is performed through heat lines, heat pipes or aluminum plates.

19. The cooling system according to claim 15 wherein the evaporator has an evaporator chamber, and in that the ejector is integrated as a unit with the evaporator chamber.

20. The cooling system according to claim 19, wherein the diffuser of the ejector is physically connected to the condenser.

21. The cooling system according to claim 20, wherein ejector, condenser and evaporator chamber are one integrated unit.

* * * * *